US008015478B2

(12) United States Patent
Miller

(10) Patent No.: US 8,015,478 B2
(45) Date of Patent: Sep. 6, 2011

(54) DATA PROCESSING

(75) Inventor: Peter John Miller, Bedfordshire (GB)

(73) Assignee: Ricardo UK Limited, West Sussex (GB)

( * ) Notice: Subject to any disclaimer, the term of this patent is extended or adjusted under 35 U.S.C. 154(b) by 1079 days.

(21) Appl. No.: 11/597,144

(22) PCT Filed: May 18, 2005

(86) PCT No.: PCT/GB2005/001923
§ 371 (c)(1),
(2), (4) Date: May 25, 2007

(87) PCT Pub. No.: WO2005/114848
PCT Pub. Date: Dec. 1, 2005

(65) Prior Publication Data
US 2008/0104492 A1 May 1, 2008

(30) Foreign Application Priority Data
May 18, 2004 (GB) .................................. 0411053.2

(51) Int. Cl.
*G06F 11/00* (2006.01)
(52) U.S. Cl. .................. 714/807; 714/758; 714/808
(58) Field of Classification Search .................. 714/807, 714/809, 758, 754, 808
See application file for complete search history.

(56) References Cited

U.S. PATENT DOCUMENTS

| 5,390,196 | A |   | 2/1995  | Cecil et al.     |         |
|-----------|---|---|---------|------------------|---------|
| 5,663,952 | A | * | 9/1997  | Gentry, Jr.      | 370/252 |
| 5,960,012 | A |   | 9/1999  | Spracklen et al. |         |
| 5,996,113 | A |   | 11/1999 | Korn et al.      |         |
| 6,061,703 | A |   | 5/2000  | DeBellis et al.  |         |
| 6,289,023 | B1 | * | 9/2001  | Dowling et al.   | 370/419 |
| 6,438,724 | B1 | * | 8/2002  | Cox et al.       | 714/758 |
| 7,284,181 | B1 | * | 10/2007 | Venkatramani     | 714/758 |
| 7,360,148 | B2 | * | 4/2008  | D'Arcy et al.    | 714/807 |
| 7,590,996 | B2 | * | 9/2009  | Medvinsky        | 725/107 |
| 2001/0037323 | A1 |  | 11/2001 | Moulton et al.  |         |
| 2002/0092015 | A1 | * | 7/2002 | Sprunk et al.    | 725/9   |

FOREIGN PATENT DOCUMENTS

EP    1 065 595    1/2001

(Continued)

OTHER PUBLICATIONS

"Numerical Recipes in C: The Art of Scientific Computing" Numerical Recipes: (ISBN 0-521-043108-5) Copyright © 1988-1992 by Cambridge University Press Programs Copyright © 1988-1992 by Numerical Recipes Software Library.Lanl.Gov, 'Online! 1992, pp. 894-896, XP002338997.
Patent Abstracts of Japan 2001053621 dated Feb. 23, 2001 (1 page).
International Search Report for PCT/GB2005/001923 mailed Aug. 30, 2005 (2 pages).
http://www.ecse.rpi.edu/Courses/F03/ECSE-2610/Part3.ppt.
<http://www.deeds.informatik.tu-darmstadt.de/course/slides/Lec%205%20Chp7.pdf>.

(Continued)

*Primary Examiner* — Fritz Alphonse
(74) *Attorney, Agent, or Firm* — Osha Liang LLP

(57) ABSTRACT

A non-transitory computer readable medium includes a computer program, which when executed by a processor performs a method, the method including processing a data message to extract segments of data and computing a checksum by applying gray code conversions to one or more of the data segments, wherein only one bit changes on each count when consecutive integers are represented as bits. The method further includes extracting remaining data segments and adding bitwise to the previously calculated gray code checksum to provide the next checksum, converting the next checksum to gray code, and adding a final gray code conversion to a final data message including all remaining data segments and transmitting the final data message.

12 Claims, 9 Drawing Sheets

FOREIGN PATENT DOCUMENTS

| | | |
|---|---|---|
| EP | 1 146 651 | 10/2001 |
| EP | 1 271 828 | 1/2003 |
| JP | 2001-53621 | 2/2001 |
| WO | WO-00/26783 | 5/2000 |
| WO | WO-2004/040818 | 5/2004 |

OTHER PUBLICATIONS http://www.cs.mu.oz.au/343/lectures/Fault-Tolerance.pdf.
Foreign Search Report dated Sep. 28, 2004 for corresponding Application No. GB0411053.2 (1 page).

* cited by examiner

| BINARY | GRAYCODE |
|--------|----------|
| 00 | 00 |
| 01 | 01 |
| 10 | 11 |
| 11 | 10 |

FIG. 4A

| MESSAGE DATABLOCK | CHECKSUM | GRAY CODE |
|-------------------|----------|-----------|
| 00 | 00 | 00 |
| 01 | 01 | 01 |
| 01 | 10 | 11 |

FIG. 4B

DATA PROCESSING

The invention relates to data processing and in particular validation of data transmitted and received from a remote source.

Various approaches are known for error detection in transmitted data. For example according to the "parity bit" approach the sum of the individual bits of a data message is calculated and an additional parity bit is added to the message such that the sum of the bits in the message together with the parity bit is either an even or an odd number dependent upon the scheme adopted. Although very quick and simple the scheme has various problems; it will not work if a message has an even number of errors or if bits in the data message are transposed.

Another approach is the simple checksum approach in which a checksum is calculated for example by adding segments of the message according to some modulo scheme. The checksum is added to the data message which is transmitted as a datastream. At the receiving end the checksum is extracted and the calculations repeated to ensure that the checksum is correct. However this approach may miss multiple self-cancelling errors, reordering of data or "stuck at zero" errors where all of the bits have been reset to zero (in which case the checksum will be zero as well).

A more complex known scheme comprises a cyclic redundancy check (CRC) in which a frame check sequence is added to a data message, the frame check sequence being calculated such that division of the message by the frame check sequence according to an appropriate mathematical operator leaves no remainder. However this system requires more computational overhead for calculation of the frame check sequence. In addition processing is bit serial which can slow processing significantly in some implementations.

In a further approach described in EP1271828 a data message is interleaved with a pseudo randomly generated pattern. This is found to provide improved error detection but requires a pseudo random number generator.

The invention is set out in the claims. Because a checksum is generated using a non-linear mathematical operation good fault coverage is obtained using simple, fast operations whilst allowing rapid processing.

Embodiments of the invention will now be described, by way of example, with reference to the drawings, of which:

FIG. 4a shows conversion of binary code to gray code;

FIG. 4b shows calculation of a checksum according to the method of FIG. 3;

Figure 1:
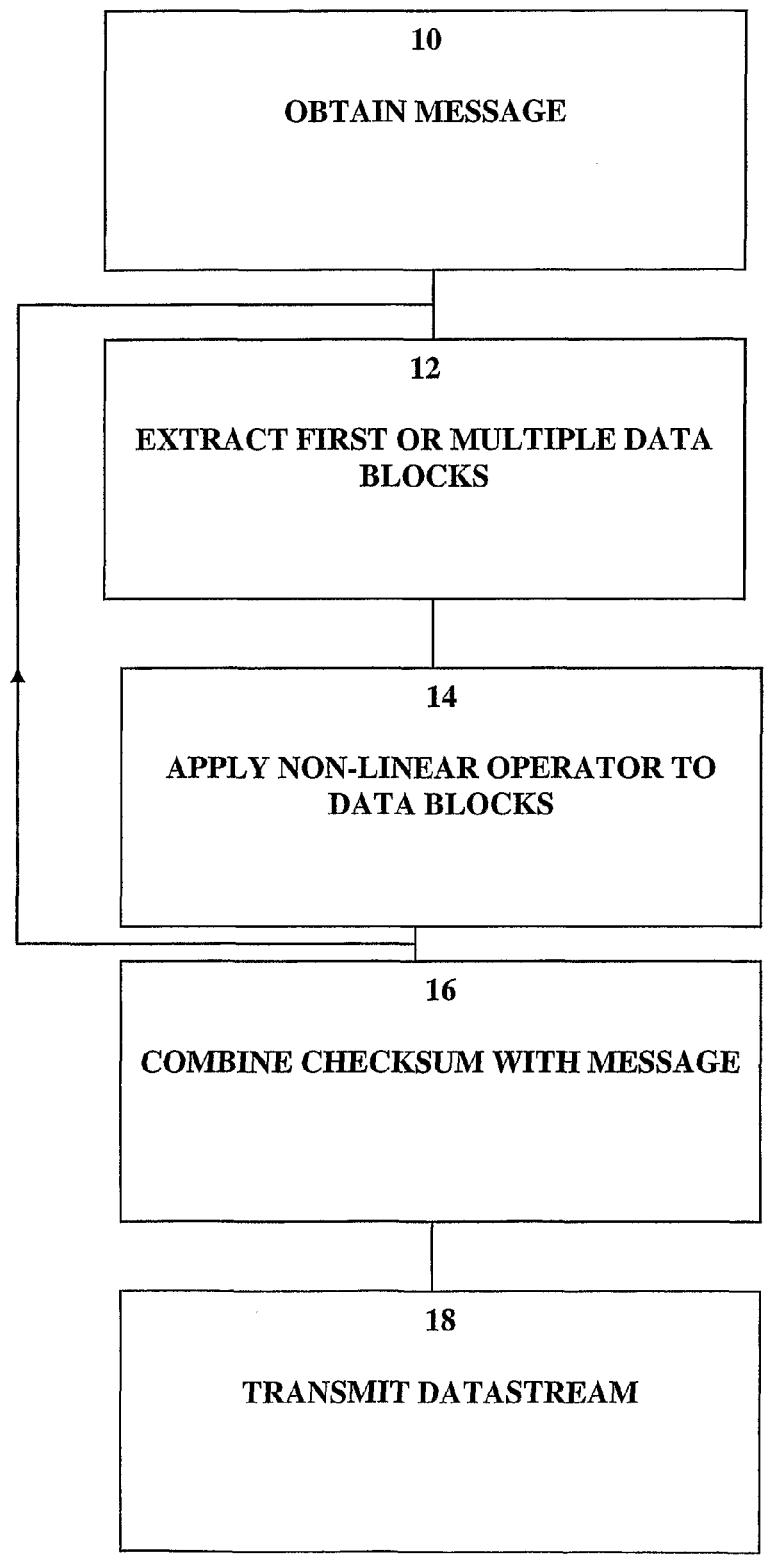
FIG. 1 is a high level flow diagram showing operation of the invention.

In overview the invention relates to the generation of a checksum by dividing a data message to be validated into data blocks or segments and combining the data blocks with non-linear operators as shown in FIG. 1. In block 10 a processor obtains the message in binary code form. In block 12 the processor extracts one or more data blocks each of which may be, for example, of a length equal to the number of bits the processor is able to process simultaneously. In block 14 the processor applies the non-linear operator to one or more of the data blocks. The processor loops through blocks 12 and 14 until the whole message has been processed and then, at block 16, combines the checksum with the message in any appropriate manner (for example by appending the checksum after the original message to create a datastream to be transmitted) and at block 18 the datastream is transmitted. Upon receipt of the datastream by a remote processor (i.e. a processor that is separated by a transmission link whether physically remote or connected within a common physical component) the checksum is extracted from the datastream, the non-linear operations are repeated on the message portion to recalculate the checksum and, if this tallies with the extracted checksum, the data is validated.

The use of non-linear operators ensures a greater likelihood that a correct checksum represents accurately transmitted data. Simple logical operators easily supported by the processor can be used and surprisingly four or less operators can be used to obtain a high level of accuracy.

Figure 2:
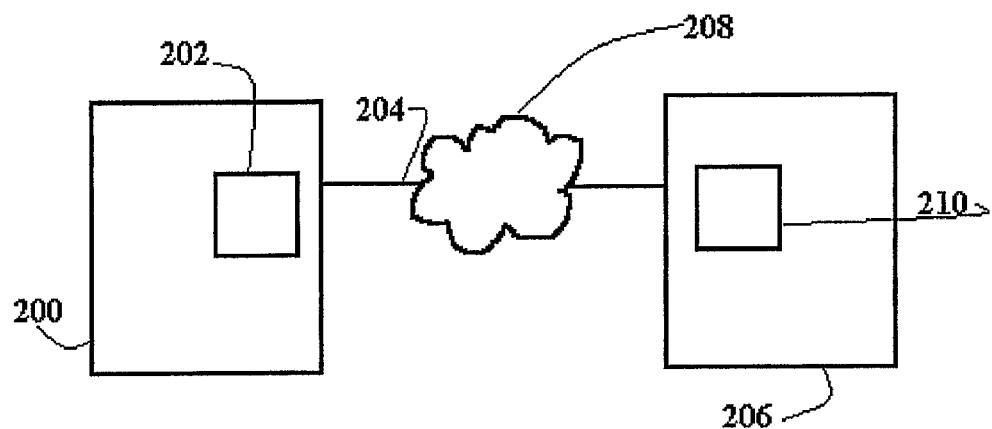
FIG. 2 shows a computer processing system configured to implement the invention.

In general the invention can be implemented on a system of the type shown in FIG. 2. A processor 200 which can be any appropriate computer processor such as a CPU includes an encoder module 202 for generating a message and checksum as described herein. The encoder transmits the message via link 204 to a remote receiving processor 206. The receiving processor 206 may be mounted on a common board, part of a common computer or distributed processor or may be remote in which case the link 204 may include the Internet, an intranet or another network 208. The receiving processor 206 includes a decoder module 210 which checks the received message and checksum to establish whether data corruption has taken place and if not validates the received message.

Figure 3:
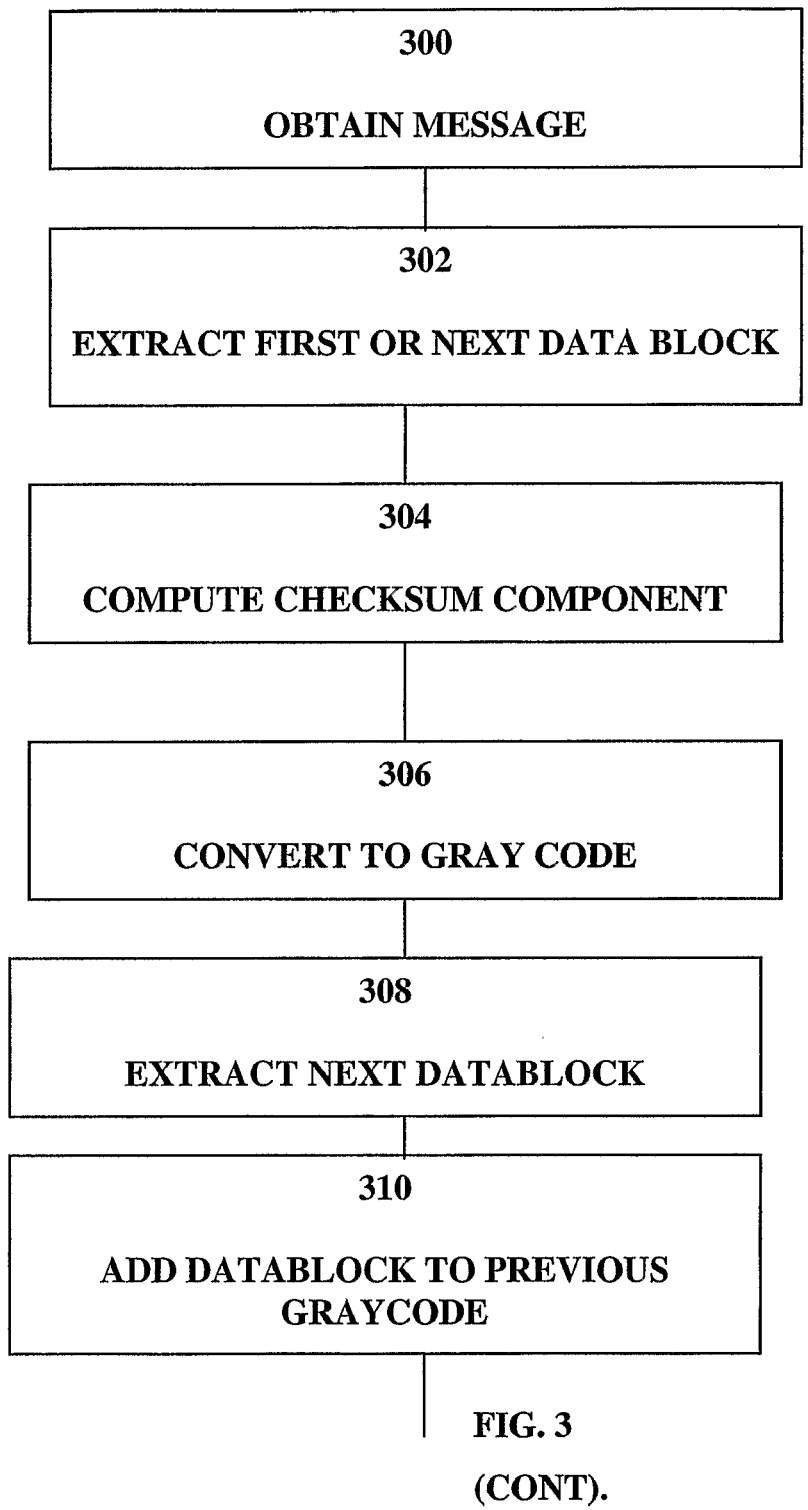
FIG. 3 is a flow diagram showing in more detail implementation of the invention according to one embodiment.
Figure 3:
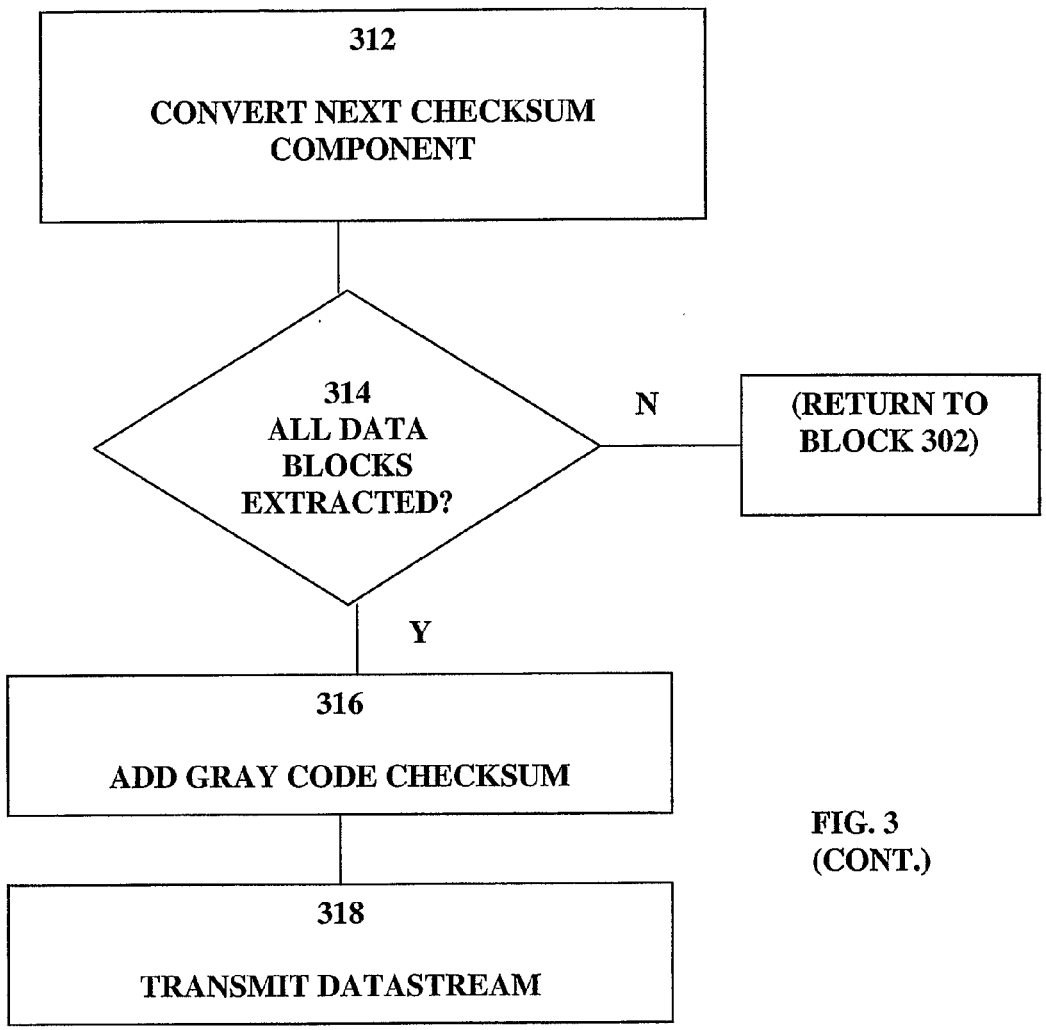

Implementation of a first embodiment of the invention can be further understood with reference to FIGS. 3, 4a and 4b. In block 300 a processor obtains a message and in block 302 the processor extracts the first data block. For example referring to FIG. 4b, where the input data message is 000101 the leftmost two bits 00 are first extracted although it will be appreciated that the approach can be adopted for a message of any length and for data blocks of any size from an individual bit upwards and that the use of data blocks of two bits is shown simply for the purpose of clarity. In block 304 a first checksum component or precursor is computed which as can be seen from FIG. 4b, is 00, by adding the individual bits of the data block. In block 306 the checksum component is converted to gray code with a value of 00 as shown in FIG. 4b.

Gray code will be well known to the skilled reader and is described at, for example, http://www.ecse.rpi.edu/Courses/F03/ECSE-2610/Part3.ppt and so is only described in summary here. In particular gray code is constructed such that only one bit changes on each count when consecutive integers are represented as bits, as opposed to binary code in which any number of bits can change on each count. For example a gray code representation of the binary numbers 00 to 11 (i.e. 0 to 3 in decimal) is shown in FIG. 4a although it will be appreciated that other gray code schemes can be constructed as appropriate.

The system then enters a loop for each of the remaining data blocks in the message. At step 308 the next data block is extracted and in block 310 the block is added bitwise to the previously calculated gray code checksum to provide the next checksum component. Referring to FIG. 4b, therefore, the next data block 01 is added to the previous gray code checksum 00 to provide a checksum component 01. In block 312 the next checksum component is converted to gray code which can be seen to be 01 referring to FIG. 4*a*. In block 314 the system establishes whether all data blocks have been extracted. If not then steps 308 to 312 are repeated but otherwise the final gray code checksum is added to the data message and the resulting datastream is transmitted in block 318. It will be appreciated that standard steps such as taking the 1's complement can be implemented to avoid a "stuck at zero" error. The datastream is received by a remote processor which follows the same steps to validate the checksum as discussed above.

The approach adopted has numerous advantages. Gray code is very simply processed at the processor level such that the checksum can be computed rapidly. Because gray code is non-linear and evenly distributed by virtue of its symmetrical counting system, the error correction properties are increased over basic checksum approaches. Because the data is processed in blocks, transmission and decoding is faster as opposed to the bit serial approach in many known error detection techniques. In fact it is found that in many cases, because simple and easily supported non-linear operators such as gray code are used, processing is faster than retrieving the data blocks from memory such that data validation effectively carries no time penalty.

Figure 5:
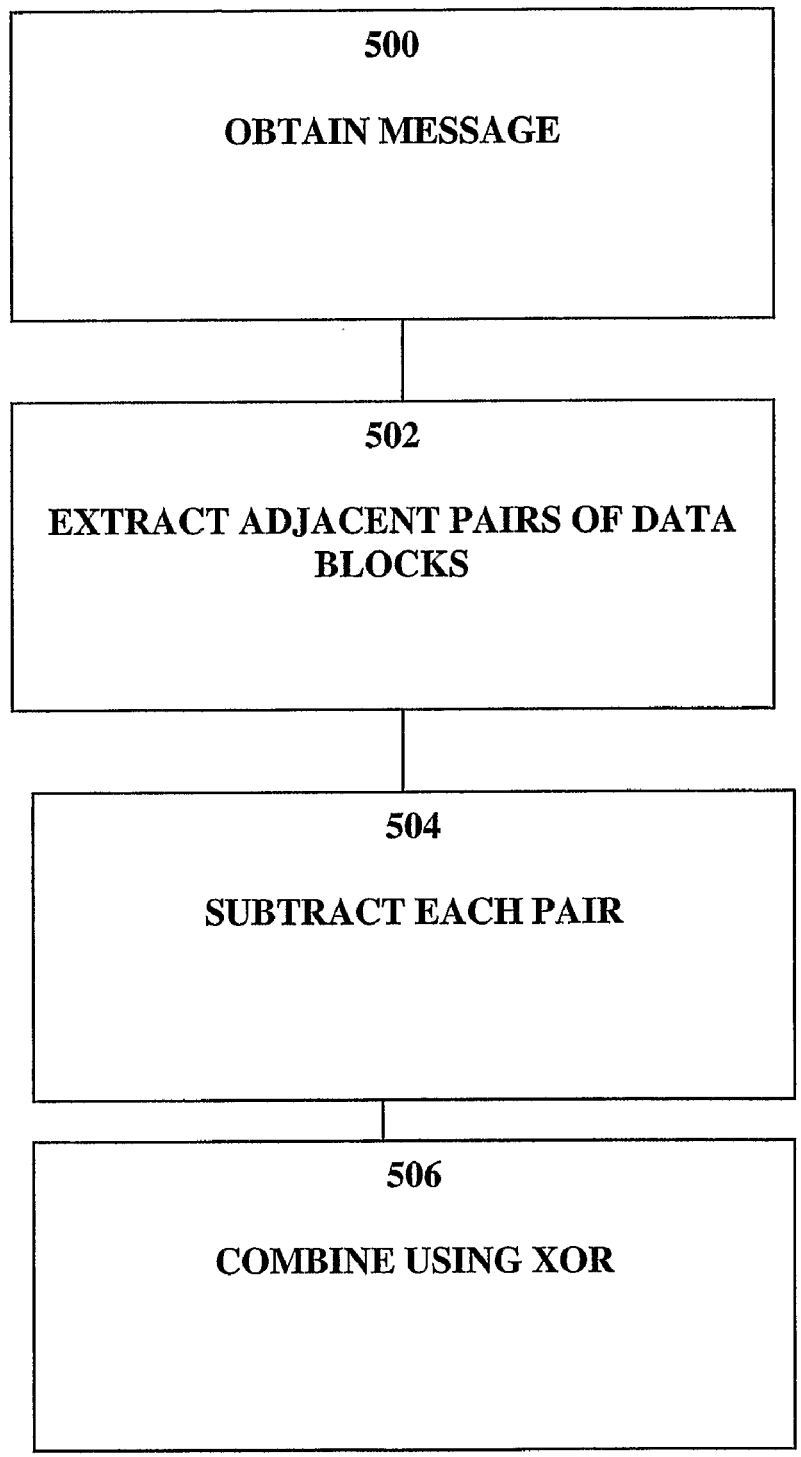
FIG. 5 is a flow diagram illustrating in more detail operation of the invention according to another embodiment.
Figure 6:
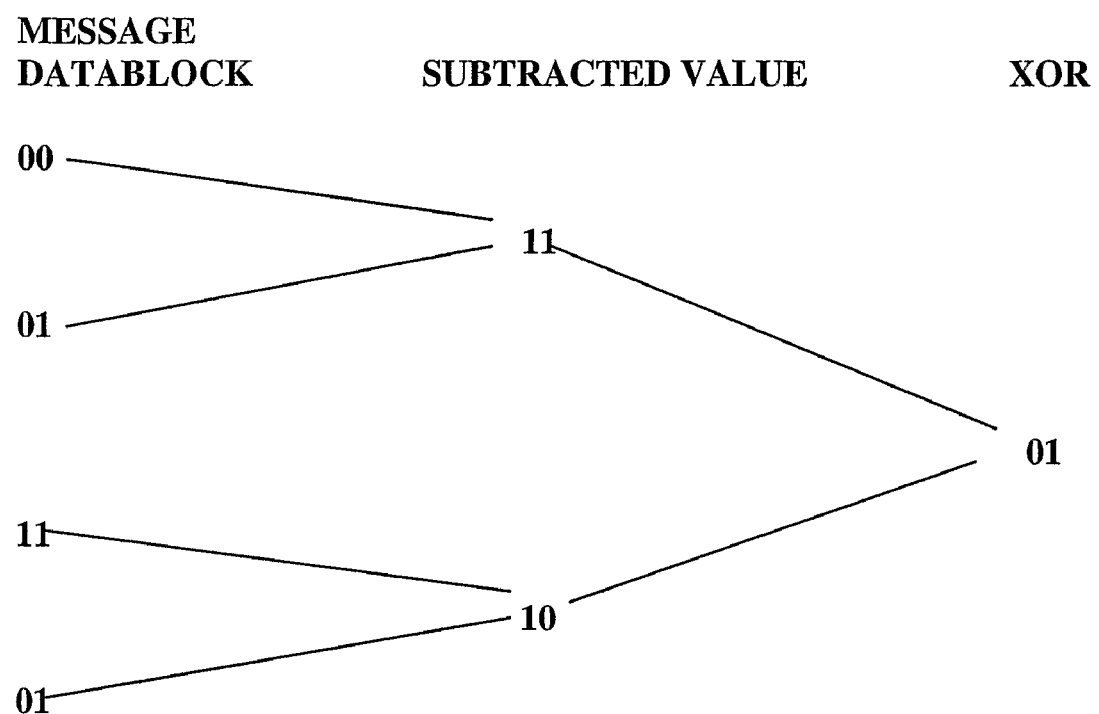
FIG. 6 shows calculation of a checksum according to the method of claim 5.

It will be appreciated that various alternative non-linear operations can be applied in order to obtain a final checksum. In particular "mixed operators" can be adopted comprising combinations of logical operators applied alternately or in a predetermined sequence to data segments and/or the results of operations applied previously to data segments to form checksum pre-cursors. One example in which "subtract" and "exclusive" or operators are applied sequentially to data blocks, is described with reference to FIGS. 5 and 6. In block 500 the processor obtains the message to be encoded. In block 502 the processor extracts adjacent pairs of data blocks. For example referring to FIG. 6 where the message is 00011101, the processor first extracts adjacent data blocks 00 and 01 and adjacent data blocks 11 and 01. In block 504 the processor performs a bitwise subtraction of each pair to provide respective values 11, 10 as shown in FIG. 6. These values are then combined using an "exclusive-or" operation to provide the checksum value 01 shown in FIG. 6 at step 506. In the case of more than two pairs of message data blocks all subtractions are performed and all subtracted values combined using the exclusive or operator simultaneously.

Figure 7:
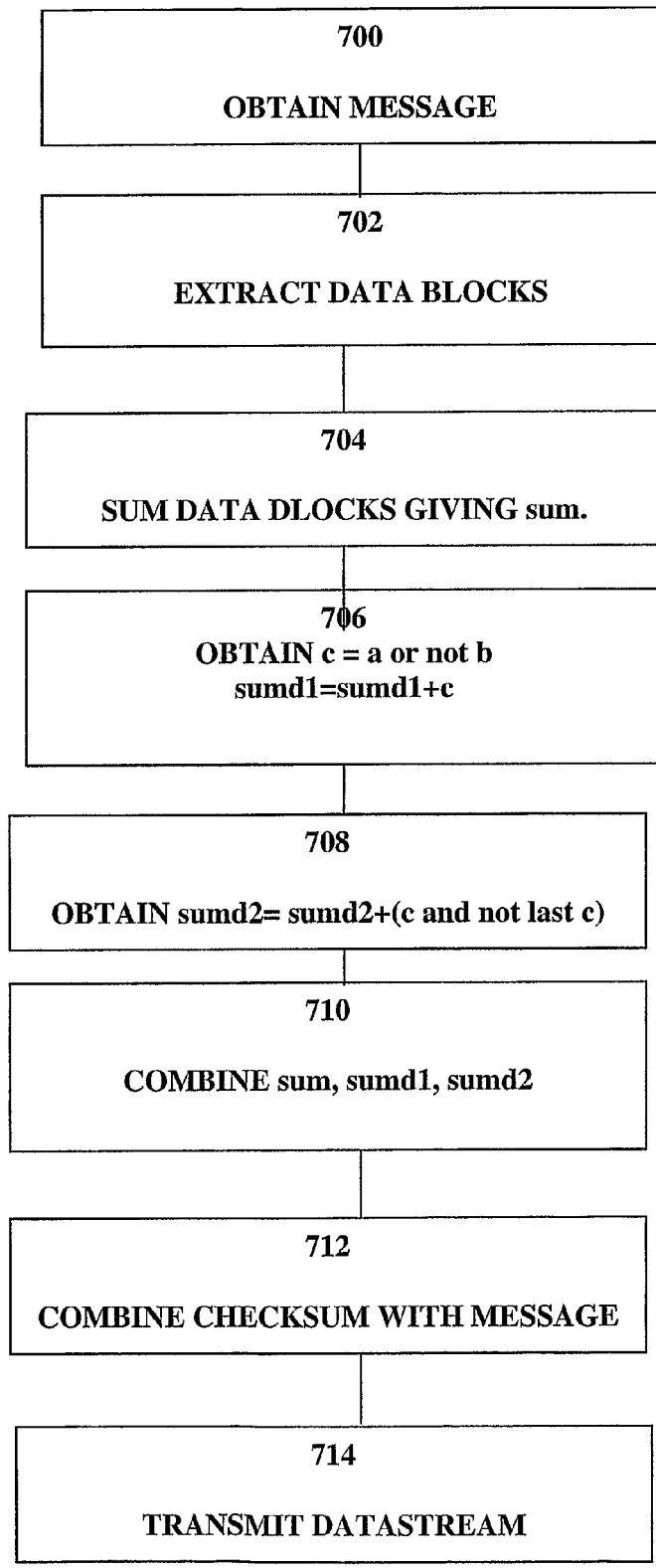
FIG. 7 is a flow diagram showing in more detail implementation of the invention according to a further embodiment.
Figure 8:
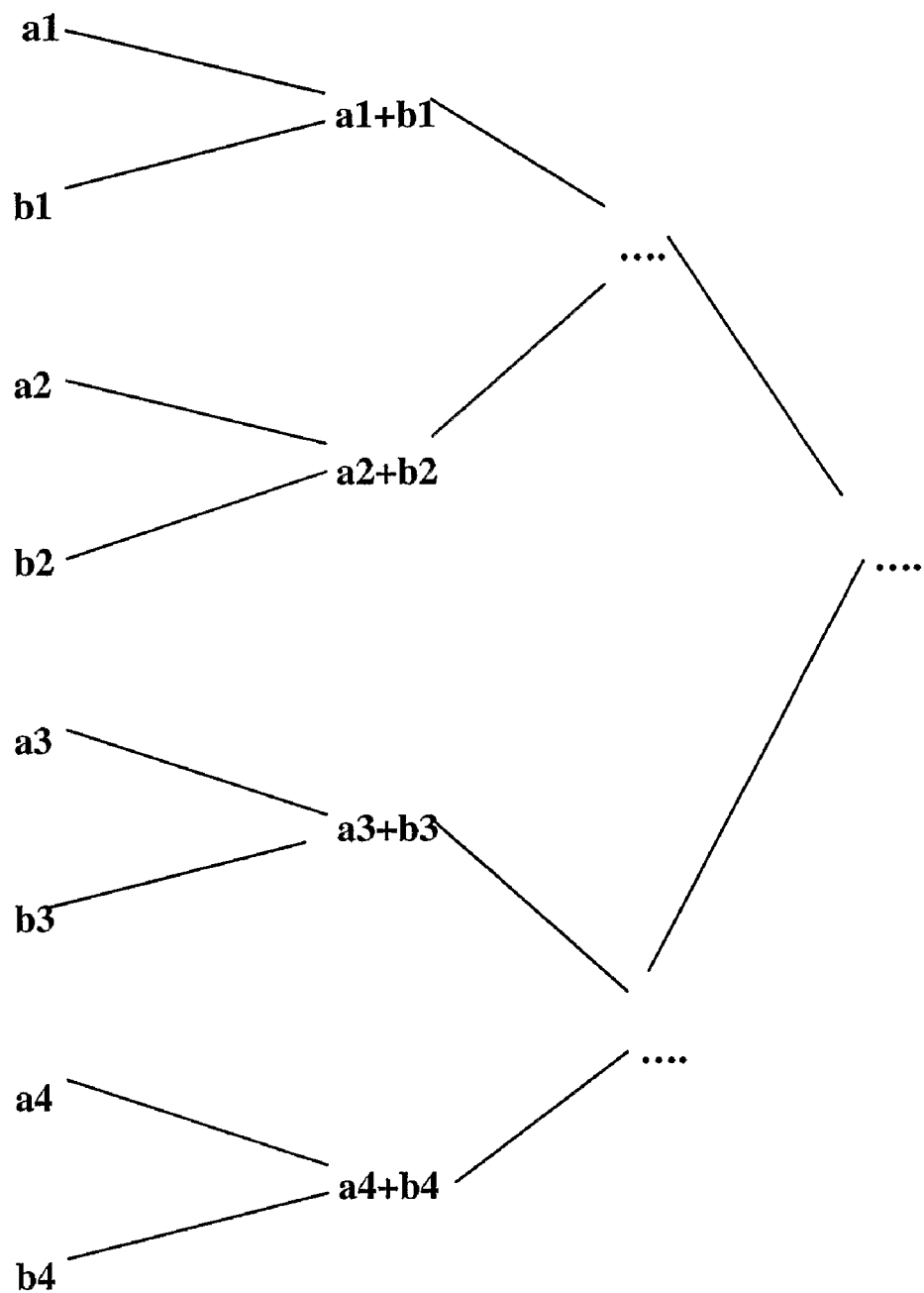
FIG. 8 shows calculation of a checksum according to the method of FIG. 7.

It will further be appreciated that more complicated sequences of logical operators can be applied and one further example is described with reference to FIGS. 7 and 8 in which logical operators "add", "a or not b", "a and not b" are applied allowing detection of data which has been disordered. Referring to FIG. 7, in block 700 the message is obtained and in block 702 data blocks are extracted. In block 704 the data blocks are summed. As shown in FIG. 8 where the message comprises data blocks a1, b1, a2, b2 etc, the sum for each pair a 1+b1, a2+b2 is hence computed. In block 706 the value c is obtained from "a or not b" to detect non-linear data a the value sumd1 is incremented by c. In block 708 a further value sumd2 is computed from the addition of a nonlinear combination of the current value of c and the previous value of c (c and not last c) as shown in FIG. 8. In block 710 the values of sum, sumd1 and sumd2 are combined to provide the checksum which is combined with the message at block 712 and the resulting datastream is transmitted at block 714.

It will be appreciated that the invention can be implemented in any appropriate manner and, for the purposes of example, the embodiment described with reference to FIGS. 7 and 8 can be encoded in the C programming language as set out below:

```
/* nonlinchecksum , normal checksum (with carries wrapped around)
combined with
    nonlinear combination of pairs of data designed to detect swapped
words of data,
    this process is repeated "recursively" to detect "swapped pairs of
swapped pairs" */
u32 nonlinchecksum1(u32 *bp) /* takes pointer to buffer to compare,
returns checksum */
{int nwords=BUFSIZE; /* size of buffer */
    u64 sum=0; /* "normal" checksum */
    u64 sumd1=0,sumd2=0; /* sum by pairs - nonlinear operator a | ~b and
a&~b used on pairs */
    u32 a,b,c,lastc=0; /* temp storage for data pairs */
    while(nwords > 1)
        {
        a=(*bp++) ; /* 1st data item */
        sum+=a;
        b=(*bp++) ; /* 2nd data item */
        sum+=b; /* add to normal checksum */
        c=(a | ~b); /* nonlinear combination of a,b detects out order data */
        sumd1+=c;
        sumd2+=(u64)((u32)(c & ~lastc)); /* nonlinear comb. of last 2
non-linear combs on data pairs*/
        lastc=c;
        nwords-=2;/* */
        }
    if(nwords>0)
        {/* do last item */
        a=(*bp++) ; /* 1st(last) data item */
        sum+=a; /* add to normal checksum */
        c=(u32)(~0L); /* zero pad data so add in ~0 */
        sumd1+=c; /* nonlinear combination detects out order data */
        sumd2+=(u64)((u32)(c & ~lastc)); /* nonlinear comb. of last 2
non-linear combs on data pairs*/
        }
    sum += sumd1<<7; /* combine sums, ensuring bits don't align */
    sum+=sumd2<<3; /* combine sums, ensuring bits don't align */
    /* next lines only make sense if we have real u64 */
    sum=(sum>>32) + (sum &0xffffffffL); /* adds in carries of lower 32
bits back in */
    sum+=(sum>>32); /* in case above add caused more carries */
    return (u32) sum;
}
```

It will be appreciated that any appropriate combination of non-linear operation can be adopted and that the embodiments described above are for the purposes of example only.

Because the system generates a checksum which has a reasonable likelihood of being unique to the corresponding data message this encoding approach can be used for example in exact voting systems of the type described in http://www.deeds.informatik.tu-darmstadt.de/course/slides/ Lec%205%20Chp7.pdf and http://www.cs.mu.oz.au/343/ lectures/Fault-Tolerance.pdf and described in more detail in a co-pending application filed on the same day as the present application in the name of Ricardo UK Limited entitled "Fault Tolerant Data Processing". The skilled reader will be familiar with the concept of exact voting and so it will be described only in summary here.

In particular exact voting can be used in applications where fault tolerance is required, for example where a value such as a sensor input is calculated independently at multiple processors to obtain redundancy. In such an event, the independent values can be compared to establish where there is correspondence between them and, whether there are three or more processors, as long as a majority of the values correspond, the majority value is adopted as the correct value, forming a majority voting scheme.

Accordingly the various data values must be compared but it will be seen that where they have been encoded using the scheme described above, instead of comparing the entire data message in an optimisation it is possible simply to compare the checksums which should be identical in the case of identical data. Where there are differences between the checksums, if the majority of the checksums agree then these are taken to represent the correct data and the corresponding data message is extracted. As a result the computational overhead is reduced as against the requirement to compare the entire data message in each case.

It will be appreciated that the invention can be implemented in any appropriate form such as hardware, software or firmware and, where appropriate, in any code such as the C programming language. Any specific processing and encoding approach can be applied to data blocks comprising single or multiple bits, and in binary, hexadecimal or other appropriate formats. The data can be transmitted according to any appropriate communications protocol and any appropriate non-linear operator or set of operators can be applied individually, alternately, or in any order, and either to individual bits of a data block, to multiple data blocks, or to checksum precursors comprising the result of operations already performed on data blocks. In addition to the operators and combinations of operators described above, preferred operators will be non-biased or self-cancelling and hence symmetrical combinations such as "exclusive-or" and "subtract" or "and" and "or".

The invention can be used in any application if required for example in a data communications network such as the Internet or in a distributing processing environment comprising multiple communicating processors such as an engine control unit (ECU).

The invention claimed is:

1. A non-transitory computer readable medium comprising a computer program, which when executed by a processor performs a method, the method comprising:
   processing a data message to extract segments of data;
   computing a checksum by applying gray code conversions to one or more of the data segments, wherein only one bit changes on each count when consecutive integers are represented as bits;
   extracting remaining data segments and adding bitwise to the previously calculated gray code checksum to provide the next checksum;
   converting the next checksum to gray code; and
   adding a final gray code conversion to a final data message including all remaining data segments and transmitting the final data message.

2. The non-transitory computer readable medium of claim 1, wherein the non-linear operator comprises a sequence of two or more logical operators.

3. The non-transitory computer readable medium of claim 1, wherein the step of computing the checksum comprises computing a checksum precursor and applying a logical operator to data segments and checksum precursors.

4. The non-transitory computer readable medium of claim 3, wherein the data message comprises a sequence of data segments, and a checksum precursor is computed for a data segment from a logical operator applied to the data segment and the checksum precursor computed for the sequentially preceding data segment.

5. The non-transitory computer readable medium of claim 4, wherein the logical operator comprises bitwise addition or subtraction.

6. The non-transitory computer readable medium of claim 4, wherein computation of the checksum precursor further comprises conversion of the result of the application at the logical operator to gray code.

7. The non-transitory computer readable medium of claim 4, wherein a checksum precursor is computed for the sequentially first data segment from a logical operation applied to the constituent bits of the segment.

8. The non-transitory computer readable medium of claim 7, wherein the logical operator comprises addition or subtraction.

9. The non-transitory computer readable medium of claim 1, wherein a data segment comprises a block of data.

10. The non-transitory computer readable medium of claim 1, the method further comprising combining the checksum with the data message to create a datastream and transmitting the datastream.

11. A non-transitory computer readable medium comprising a computer program, which when executed by a processor performs a method, the method comprising:
    processing the datastream to extract a checksum and a data message;
    processing the data message to extract segments of data;
    applying a gray code conversion to one or more of the data segments to compute a validation checksum; and
    comparing the validation checksum with the extracted checksum.

12. The non-transitory computer readable medium of claim 1, the method further comprising:
    determining an agreed version of a datastream, wherein datastream versions are received from multiple sources;
    extracting a checksum from each datastream version;
    comparing the extracted checksums; and
    validating a datastream if the or a majority of checksums corresponding to the datastream are the same.

* * * * *